United States Patent
Milne et al.

(10) Patent No.: US 7,082,594 B1
(45) Date of Patent: Jul. 25, 2006

(54) COMPILATION IN A HIGH-LEVEL MODELING SYSTEM

(75) Inventors: Roger B. Milne, Boulder, CO (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 279 days.

(21) Appl. No.: 10/717,041

(22) Filed: Nov. 18, 2003

(51) Int. Cl.
*G06F 17/50* (2006.01)

(52) U.S. Cl. .................... 716/18; 716/1; 716/4

(58) Field of Classification Search ........... 716/2, 716/4, 6, 17, 1, 18
See application file for complete search history.

(56) References Cited

U.S. PATENT DOCUMENTS 6,823,497 B1 * 11/2004 Schubert et al. ............ 716/4

* cited by examiner

*Primary Examiner*—Thuan Do
(74) *Attorney, Agent, or Firm*—LeRoy D. Maunu

(57) ABSTRACT

Methods and apparatus are disclosed for compiling high-level blocks of an electronic hardware design in a high-level modeling system (HLMS) into hardware description language (HDL) components. Clock requirements are established, along with (optionally) explicit connections from implicit connections between the high-level blocks. In one pass through the high-level blocks, HDL components are generated that are consistent with the clock requirements and explicit connections, if any.

18 Claims, 6 Drawing Sheets

| 250 | Design-to-Hardware-Description Translation |
|---|---|
| 252 | Perform necessary design-wide work on high-level blocks |
| 254 | Prepare implementers |
| 256 | $b_h$ := top block of the HLMS design |
| 258 | Compile $(b_h)$ |
| 260 | Complete all pending work in the implementers |

FIG. 5

| 280 | Compile $(b_h)$ | |
|---|---|---|
| 282 | Allocate memory for a compiler block | |
| 284 | Translate $b_h$ into appropriate type of compiler block, $b_k$ | |
| 286 | If $b_h$ has sub-blocks then | |
| 288 | | For each sub-block, $b_j$ |
| 290 | | Compile $(b_j)$ |
| 292 | Implement $b_k$ using the appropriate implementer | |
| 294 | Save a lightweight description of the HDL implementation of $b_k$ in association with the parent block of $b_k$ | |
| 296 | Free the memory of the compiler block $b_k$ | |
| 298 | Return | |

FIG. 6

COMPILATION IN A HIGH-LEVEL MODELING SYSTEM

FIELD OF THE INVENTION

The present invention generally relates to compiling electronic hardware designs in a high-level modeling system.

BACKGROUND

A high level modeling system (HLMS) is a software tool in which electronic designs can be described, simulated, and translated by machine into a design realization. An HLMS provides a higher level of abstraction for describing an electronic circuit than a hardware description language (HDL). An HLMS generally provides a mathematical representation of signals as compared to standard logic vectors in a hardware description language (HDL). The Xilinx System Generator tool for DSP is an example of an HLMS.

An HLMS for electronic circuit design generally offers abstractions that are not available in traditional HDLs. For example, an HLMS is likely to offer abstractions that relate to signal propagation and signal state, while an HDL may support a detailed representation that more closely models a realized electronic circuit.

An electronic design modeled in an HLMS may be viewed as a collection of blocks that communicate through signals, with the blocks being organized into levels of a hierarchy. Signals in an HLMS are discrete, time-varying sequences of values. An HLMS generally provides abstractions to support implementing synchronous designs without requiring the specification of explicit references to clocks or clock signals.

An HLMS generally supports testing and debugging of the high-level design, along with hardware generation of the high-level design. In the process of generating hardware, the HLMS compiles the high-level blocks into HDL components. Compilation may be slow and require a large amount of memory because the entire design must be considered for some compilation operations. For example, in the System Generator HLMS, a user may specify a VHDL entity name to be used for a black box. This forces the System Generator HLMS to examine the entire high-level design before assigning names.

The present invention may address one or more of the above issues.

SUMMARY OF THE INVENTION

The various embodiments of the invention relate to compiling high-level blocks of an electronic hardware design in a high-level modeling system (HLMS) into hardware description language (HDL) components. First, in an exemplary embodiment of the present invention, global operations are performed such as establishing clock requirements and, optionally, establishing explicit connections from implicit connections between the high-level blocks. Next, in this exemplary embodiment, in one pass through the high-level blocks, HDL components are generated that are consistent with the clock requirements and explicit connections, if any.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 5 illustrates a process for translating a high-level design to a hardware description in accordance with various embodiments of the invention;

FIG. 6 illustrates a process for compiling a hierarchy of high-level blocks of a design in accordance with various embodiments of the invention;

DETAILED DESCRIPTION

The various embodiments of the invention support one-pass compilation of high-level blocks into HDL components. After establishing global HDL names and establishing explicit connections between high-level blocks from implicit connections between the blocks, HDL components are generated in one-pass through the high-level blocks.

In one embodiment, compiler blocks are generated in association with the high-level blocks of the design during compilation. Each compiler block maintains the information needed to produce an HDL implementation of the block, for example, descriptions of hardware ports, a name of a VHDL entity to be used to implement the block, and an identifier of the technique to use in implementing the block. The different techniques may include, for example, those used by the CoreGen core generator from Xilinx, Perl scripts, or simply writing a VHDL entity or Verilog module that declares each sub-block as an instance and wires together the instances in a way that corresponds to the connections contained in the original high level design.

The compiler blocks are generated when the high-level blocks in a hierarchy of levels are recursively traversed. For a high-level block that has no sub-blocks an HDL component is generated using the associated compiler block, and the computer memory that stores the compiler block is freed after the HDL component for a block has been generated. When an HDL component is generated, information such as a component name and information that describes the ports of the component are saved in association with the parent, high-level block of the implemented block. This serves to propagate descriptive information of the HDL component for use in implementing other sub-blocks of the parent block.

Figure 1:
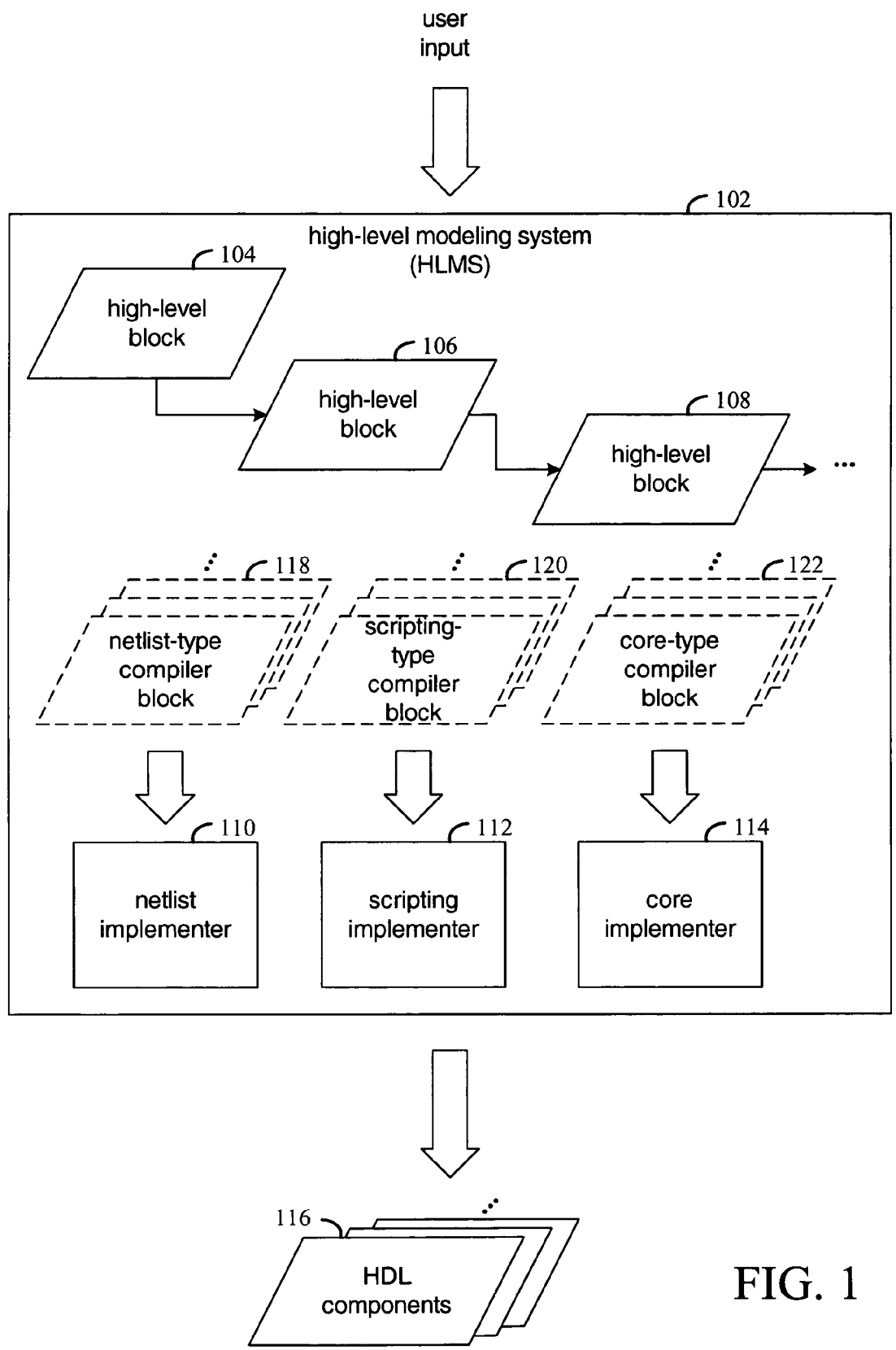
FIG. 1 is a block diagram that illustrates a high-level modeling system (HLMS) 102, an arbitrary design created with the HLMS, and intermediate data created by the HLMS and functions used by the HLMS in creating HDL components from a high-level design.

FIG. 1 is a block diagram that illustrates a high-level modeling system (HLMS) 102, an arbitrary design created with the HLMS, and intermediate data created by the HLMS and functions used by the HLMS in creating HDL components from the high-level design. High-level blocks 104, 106, and 108 are components of a high-level design created with HLMS 102; implementers 110, 112, and 114 are used by the HLMS system to generate HDL components 116; and compiler blocks 118, 120, and 122 are generated from the high-level blocks for use by the implementers. It will be appreciated that simulation capabilities of HLMS 102 are not illustrated.

A portion of an example design is illustrated with high-level blocks 104, 106, and 108. These blocks are instantiated in the design by a designer using the HLMS. Output data from component 104 are input to component 106, and output data from component 106 are input to component 108. Depending on the design requirements, a high-level block may be instantiated as a black box having a general functional specification or associated with an HDL definition of the block. It will be appreciated that each of high-level blocks 104, 106, and 108 may be comprised of one or more sub-blocks, and the sub-blocks may be comprised of further sub-blocks even though this hierarchy of levels of blocks is not illustrated.

The data associated with each high-level block generally include the information needed to present a high-level view to the user, design-specific preferences, information needed to allow the block to participate in simulations, and information needed to transform the block into an HDL component. Example information may include input and output data types, data formats, and a data rate. A high-level block may have further associated information. For example, a designer may specify for a Reed-Solomon encoder block whether to use predefined code or custom code, the bit-widths of each symbol, the number of symbols per code block, the number of information symbols in each code block, the polynomial to use in generating the code, and whether to implement the block with a reset port.

The HLMS-based design is generally organized into a hierarchy of levels of blocks and constituent sub-blocks. A specific example is provided in FIGS. 2, 3, and 4. This organization is beneficial in helping a user construct and view a design at various levels of abstraction and is also used when compiling the design in one pass.

When called upon by the user to compile the design, the HLMS 102 recursively traverses the hierarchy of high-level blocks, generating the appropriate types of compiler blocks along the way. Examples of compiler blocks include compiler blocks 118, 120, and 122.

A compiler block is generated in association with each high-level block in the hierarchy. The compiler blocks are intermediate data that are maintained by the HLMS only until a resultant HDL component is generated. This transitory characteristic of the compiler blocks is illustrated by the dashed lines of blocks 118, 120, and 122. Furthermore, not all the compiler blocks will be maintained at once by the HLMS.

Each compiler block includes the information needed to generate HDL code from the high-level block. For example, in the Reed-Solomon encoder a compiler block may include: a description of each hardware port, including the HDL name, direction, and type; the name of the VHDL entity or Verilog module to be used to implement the encoder; the technique (e.g., CoreGen, Perl mapping) to use when implementing the block; and implementation details appropriate to the technique, such as a set of instructions for the CoreGen generator.

In one embodiment there are different types of compiler blocks that indicate how the block is to be implemented. The types of compiler blocks include netlist-type compiler blocks 118, scripting-type compiler blocks 120, and core-type compiler blocks 122. A netlist-type compiler block is a non-leaf block in the hierarchy that is implemented as a VHDL entity or Verilog module, for example. The entity or module for a netlist-type compiler block is generated by the netlist implementer 110. The sub-blocks of a netlist-type compiler block may be either netlist-type compiler blocks or scripting-type compiler blocks.

The netlist implementer 110 is a tool that, given a netlist-type compiler block, writes a VHDL entity or Verilog module that declares each sub-block as an instance, and wires together the instances in the appropriate way.

A scripting-type compiler block is implemented by the scripting implementer 112 as a set of HDL components, each of which is generated by applying predefined sequences of scripts, for example, Perl scripts, to predefined template HDL files. A scripting-type compiler block may be a leaf or may contain one or more core-type sub-blocks.

A scripting-type compiler block may include information such as the VHDL entity and name instance to use for the block; VHDL names, types, directions and default values to be used for the block; names of the template files to used to create VHDL for the block; names of the scripts that should be run to configure each template; and configuration instructions for the scripts.

The scripting implementer expects that each scripting-type compiler block is tagged with the names of files to deliver, and instructions for creating each file. The instructions for a file consist of the name of a file to start with, a sequence of scripts to run on the file, and a set of parameters to use in each script. The results of each script are fed to the next script in the sequence, and the results of the last script are what actually get delivered. Various embodiments of a scripting-type implementer are described in the patent application entitled "TRANSLATION OF AN ELECTRONIC INTEGRATED CIRCUIT DESIGN INTO HARDWARE DESCRIPTION LANGUAGE", to Jonathan B. Ballagh, et. al., Ser. No. 10/388,711 filed on Mar. 14, 2003 and assigned to the assignee of the present application. The contents of this patent application are incorporated herein by reference.

An HDL component produced by the scripting implementer generally consists of a few VHDL files, each of which has been produced by tailoring template files using scripts in simple ways. For example, a multiplier that is produced by the scripting implementer consists of a single file that is obtained by assigning a VHDL entity name, and by adjusting a few connections to one or several underlying multiplier cores.

A core-type compiler block, in a particular example embodiment, is implemented by core implementer 114 as a CoreGen-type core. The CoreGen core generator is a software application that generates specialized circuit components, for example, multipliers, Reed-Solomon encoders, FIR filters and many others. The CoreGen core generator may be called by the System Generator tool or used as a general purpose tool that is callable from other applications. Generally cores may be tailored to perform well on a particular hardware technology, for example, Xilinx FPGAs. To generate a core, a sequence of parameters that describe the core is assembled and then submitted to the CoreGen core generator.

The core, in general, is implemented as one or several files. These files may be VHDL, Electronic Design Interchange Format (EDIF), or a proprietary format such as NGC from Xilinx, for example. A core-type compiler block may include information such as a VHDL entity and instance name to be used for the block; VHDL names, types, directions, and default values to be used for the block; and a sequence of parameters that defines the characteristics of the core.

The core implementer 114 expects that each core-type compiler block is tagged with a sequence of instructions to be used to implement the block by a tool such as the CoreGen core generator from Xilinx. The core implementer tracks whether a particular core has already been generated, and, if not, adds the instructions to a master script to be passed to the Core Generator system. After all high-level blocks in the design have been traversed and compilation work for the blocks is complete, the translation process (e.g., process 250 of FIG. 5) invokes the CoreGen core generator system on the script.

Figure 2:
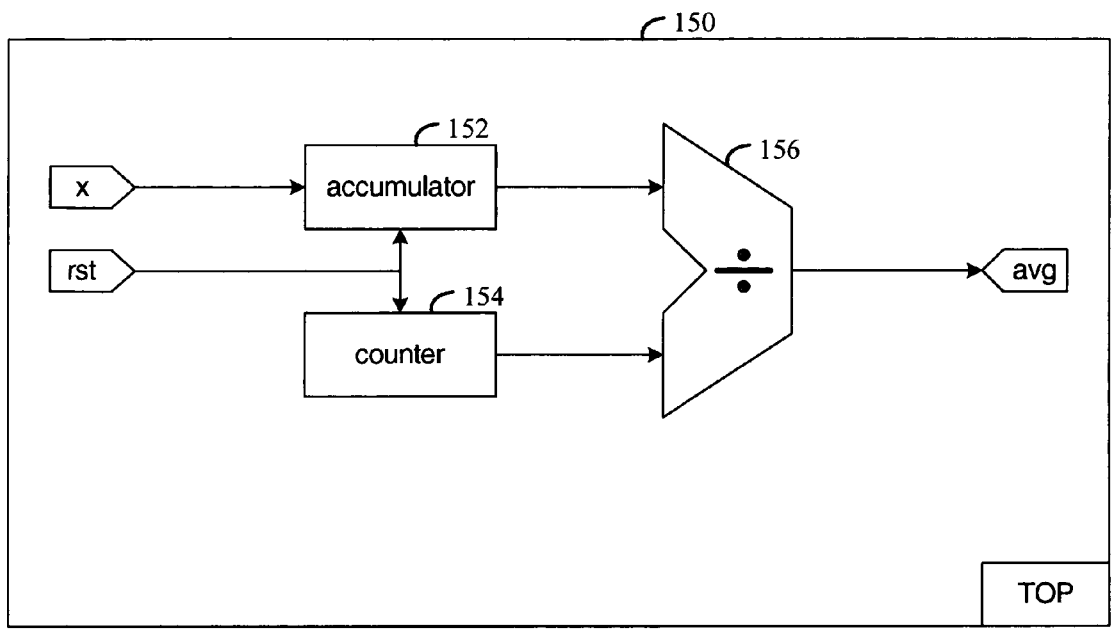
FIG. 2 illustrates an example top-level view of a high-level design in an HLMS.
Figure 3:
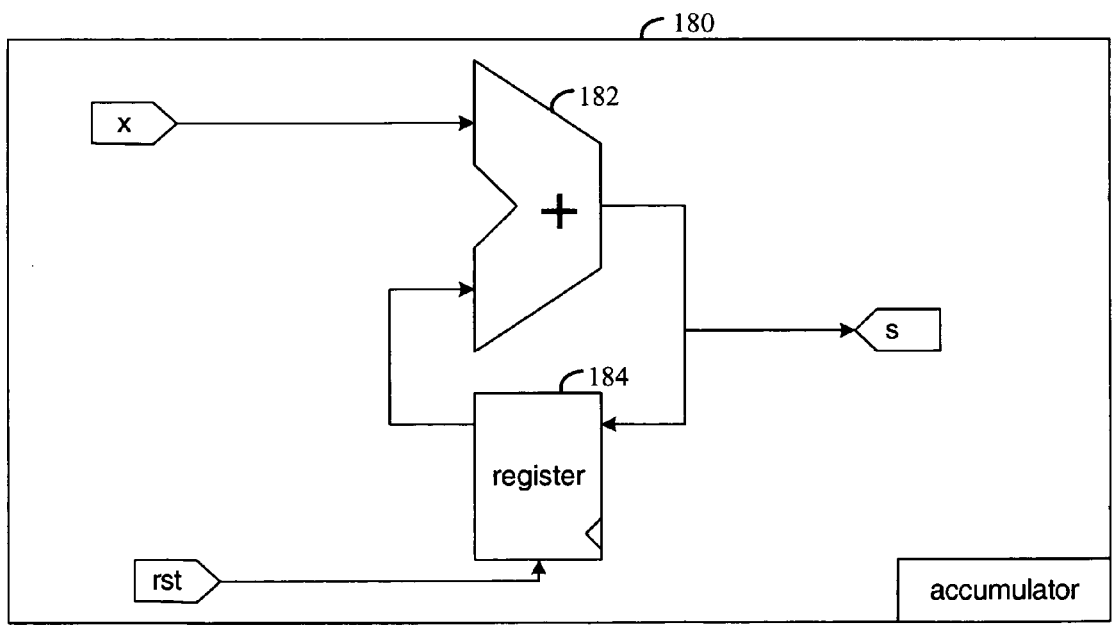
FIG. 3 illustrates an example view of the high-level blocks that define an accumulator block from the top-level view of FIG. 2.
Figure 4:
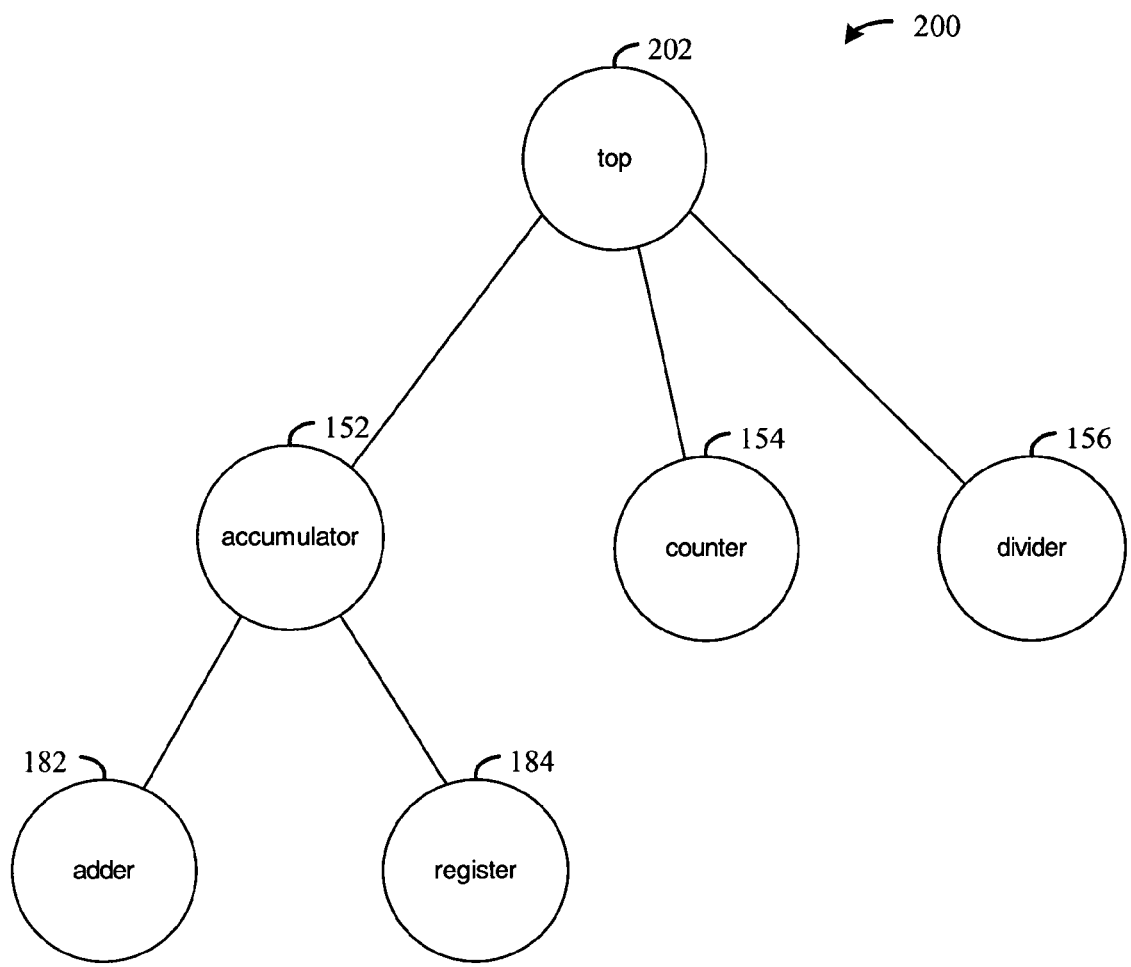
FIG. 4 illustrates a hierarchy used by the HLMS to represent the high-level blocks in the example design of FIGS. 2 and 3.

FIGS. 2, 3, and 4 illustrate an example of a high-level design that may be translated according to the techniques described above and the process illustrated in FIGS. 5 and 6. FIG. 2 illustrates an example top-level view 150 of a high-level design in an HLMS. The design determines the average value of an input set of values. Values are input on port x and accumulated by accumulator block 152. Counter block 154 counts the number of input values that have been accumulated. Divider block 156 divides the value from the accumulator block 152 by the value from the counter block 154, and the result is output on port avg. A reset signal is input on port rst and applied to the accumulator block 152 and counter block 154.

FIG. 3 illustrates an example view 180 of the high-level blocks that define the accumulator block 152 from the top-level view 150 of FIG. 2. Adder block 182 adds the input value from port x to the current accumulated value that is held in register 184. The sum generated by adder block 182 is output on port S.

FIG. 4 illustrates a hierarchy 200 used by HLMS 102 to represent the high-level blocks in the example design of FIGS. 2 and 3. The nodes in the hierarchy are shown as circles consistent with typical directed graph-type data structures, even though the nodes correspond to "blocks" in the design. For ease of reference, the representation of a high-level block in the hierarchy 200 will be referred to as a block and not a "node" or "circle." It will be understood that the hierarchy 200 of blocks provides an alternative view of the relationship between the blocks of FIGS. 2 and 3.

The top block 202 serves as the entry point for the design and correspond to the top view 150 of FIG. 2. The top block 202 is a parent of accumulator block 152, counter block 154, and divider block 156. Accumulator block 152 is a parent of adder block 182 and register 184. Blocks 152, 154, and 156 are referred to as sub-blocks of block 202. Similarly, blocks 182 and 184 are sub-blocks of block 152.

FIG. 5 illustrates a process 250 for translating a high-level design to a hardware description in accordance with various embodiments of the invention. Initially, any necessary design-wide or global work is performed on the high-level blocks (step 252). For example, in the System Generator HLMS, the global operations include: determining how and where to insert one or more clocks and/or clock drivers in the design (typically the high level blocks in the high level design do not have clocks associated with them. AS a normal design practice, one of ordinary skill in the art will insert these one or more clocks and/or clock drivers in the high level design in order to synthesized the HDL components); resolving implicit connections (such as GOTOs and FROMS) to explicit connections between blocks, i.e., establishing explicit connections from implicit connections between the high-level blocks (a further description is found in the co-pending patent application, titled "Translation of Electronic Integrated Circuit Design into Hardware," by Jonathan B. Ballagh, et. al., Ser. No. 10/618,037, filed on Jul. 11, 2003, which is herein incorporated by reference); resolving HDL names so that each component that must have a particular name (e.g., a customer supplied component may require a specific customer given name) can do so without conflicting with other components in the design; and flattening the design if appropriate. A global compiler (see FIG. 7) block is also created in support of these global operations.

It will be appreciated that the process of flattening a design involves converting the design from a hierarchical design to a functionally equivalent design that has no intermediate levels of hierarchy. A design may be flattened to reduce the number of VHDL entities, and hence reduce the time and memory needed to process the design in downstream tools. A flattened design may also be easier to analyze.

The implementers are then initialized (step 254), for example, by opening any files needed by the implementers. The translation process begins with the top block 202, which is assigned to the variable $b_h$ (step 256), and the compilation process of FIG. 6 is invoked with $b_h$ (step 258). Upon return from the compilation process, HDL components will have been generated for the high-level blocks of the design, and any pending work of the implementers may be completed (step 260). The pending work may include, for example, running scripts generated by the scripting implementer 112, invoking the CoreGen core generator with parameters assembled by the core implementer 114, and closing of the data files used by the implementers.

FIG. 6 illustrates a process for compiling a hierarchy of high-level blocks of a design in accordance with various embodiments of the invention. The compilation process 280 processes a hierarchy of high-level blocks as referenced by the input block, $b_h$ (where the indices "h", "i", and "k" are integers). Memory is allocated for the compiler block to be generated from the input high-level block (step 282), and the input block $b_h$ is translated into the appropriate type of compiler block, denoted, $b_k$ (step 284). For example, the high-level block $b_h$ will have an associated type indicator that specifies the type of compiler block $b_k$ to generate. From the input of top-level block 202 to compilation process 280, the top compiler block 326 (FIG. 7) is instantiated in the hierarchy.

Figure 7:
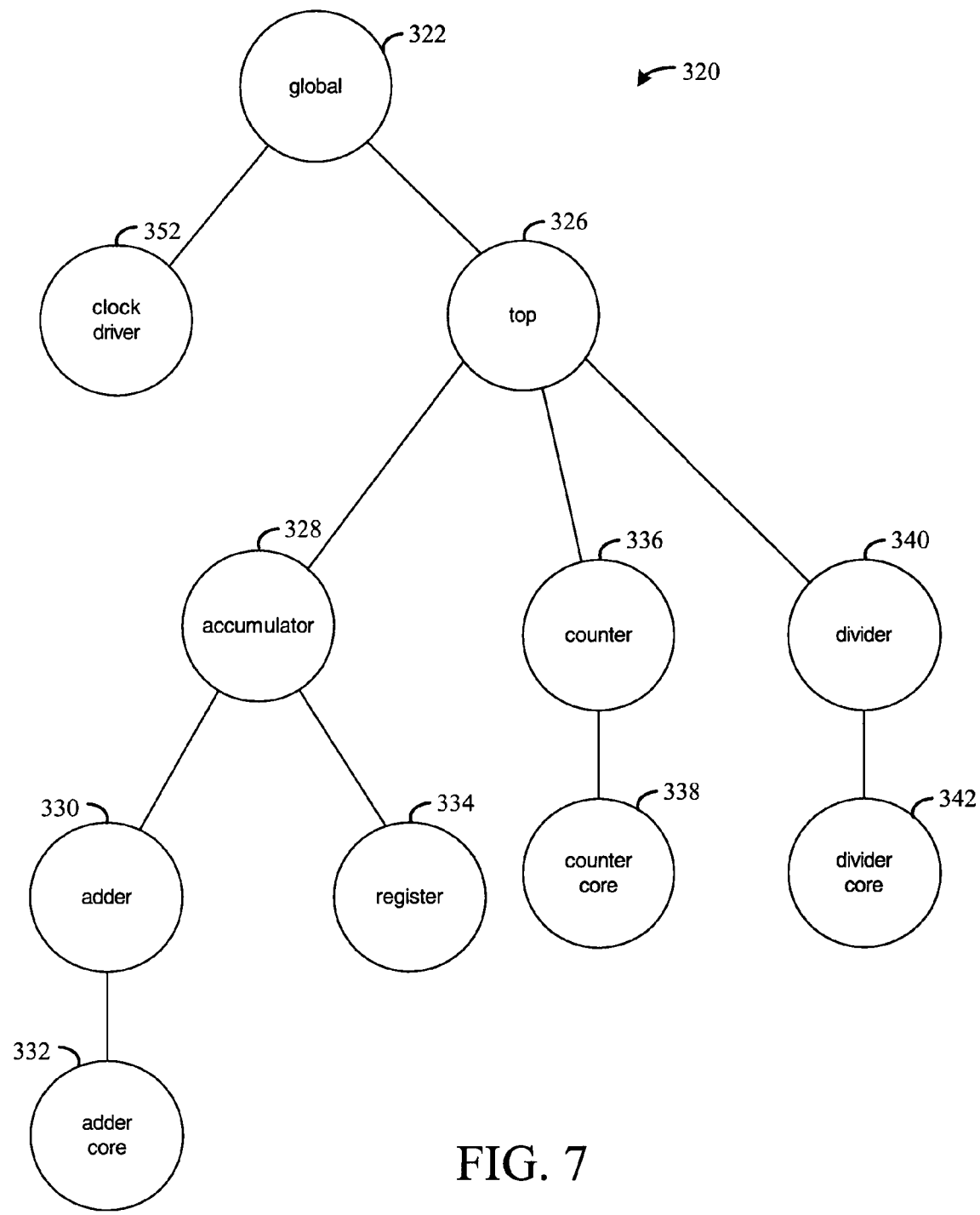
FIG. 7 illustrates an entire hierarchy of compiler blocks constructed from the hierarchy of high-level blocks (FIG. 4) during compilation of the design.

FIG. 7 illustrates an entire hierarchy 320 of compiler blocks constructed from the hierarchy 200 of high-level blocks (FIG. 4) during compilation of the design, along with the HDL components implemented from the compiler blocks. It will be appreciated that at any particular time, only a subset of the blocks exist during the compilation process 280, even though the entire hierarchy 320 is illustrated.

The global compiler block 322 instantiated as the parent block from which generation of compiler blocks begins (step 252, FIG. 5). The global block serves as a container for the entire design, as well as any additional blocks (such as, for example, a clock driver) whose outputs might be needed throughout the design. Top compiler block 326 is generated when top high-level block 202 is input to the compilation process 280. Returning now to FIG. 6, if the input high-level block has sub-blocks (step 286), then the compilation process is recursively invoked for each of the sub-blocks (steps 288 and 290). For example, if the input block $b_h$ to the Compile process is top block 202, then the compilation process is invoked for each of blocks 152, 154, and 156, beginning with accumulator block 152, for example. From accumulator block 152, the accumulator compiler block 328 is generated, and the Compiler is recursively invoked again for adder block 182, which is a sub-block of the accumulator block 152.

When adder block 182 is reached by the compilation process 280, adder compiler block 330 is generated (step 284), and the process finds that adder block 182 has no sub-blocks (step 286). When a block having no sub-blocks is encountered, the compiler block is implemented with the appropriate implementer (step 292). For example, the adder compiler block 330 is implemented as adder core 332 since adder block 182 has no sub-blocks. The adder core 332 holds a portion of a script eventually to be executed by the CoreGen core generator after all the high-level blocks have been processed. The portion consists of those parameters needed to realize a particular core in HDL.

After a compiler block $b_k$ is implemented, a lightweight description of the resulting HDL component is saved in association with the parent compiler block (step 294). For example, after generating the HDL component from the adder compiler block 330, information such as the entity/module name of the resulting HDL component that implements the adder, names of HDL types, and directions of the ports are saved in association with accumulator compiler block (328). This information may then be used when the register compiler block 334 is implemented. Once a compiler block is implemented, all the information for its subblocks may be discarded. Thus, for example, the information for the adder and register is discarded after the parent accumulator compiler block 328 is implemented.

The memory in which an implemented compiler block $b_k$ is stored may be freed once the compiler block $b_k$ is implemented (step 296). This helps to reduce the memory required during the compilation process. It will be appreciated that reducing memory requirements may decrease execution time by way of reducing memory allocation, page swapping, and garbage collection. Control is then returned to the calling process (step 298).

Compilation of the remaining high-level blocks 184 154, and 156 proceeds as described above, generating compiler blocks 334, 336, 338, 340, and 342 and implementing the compiler blocks as HDL components in the process.

Clock driver 352 may be created in a post-netlisting executable. This executable may be invoked as part of completing the pending work of the implementers (step 260).

Figure 8:
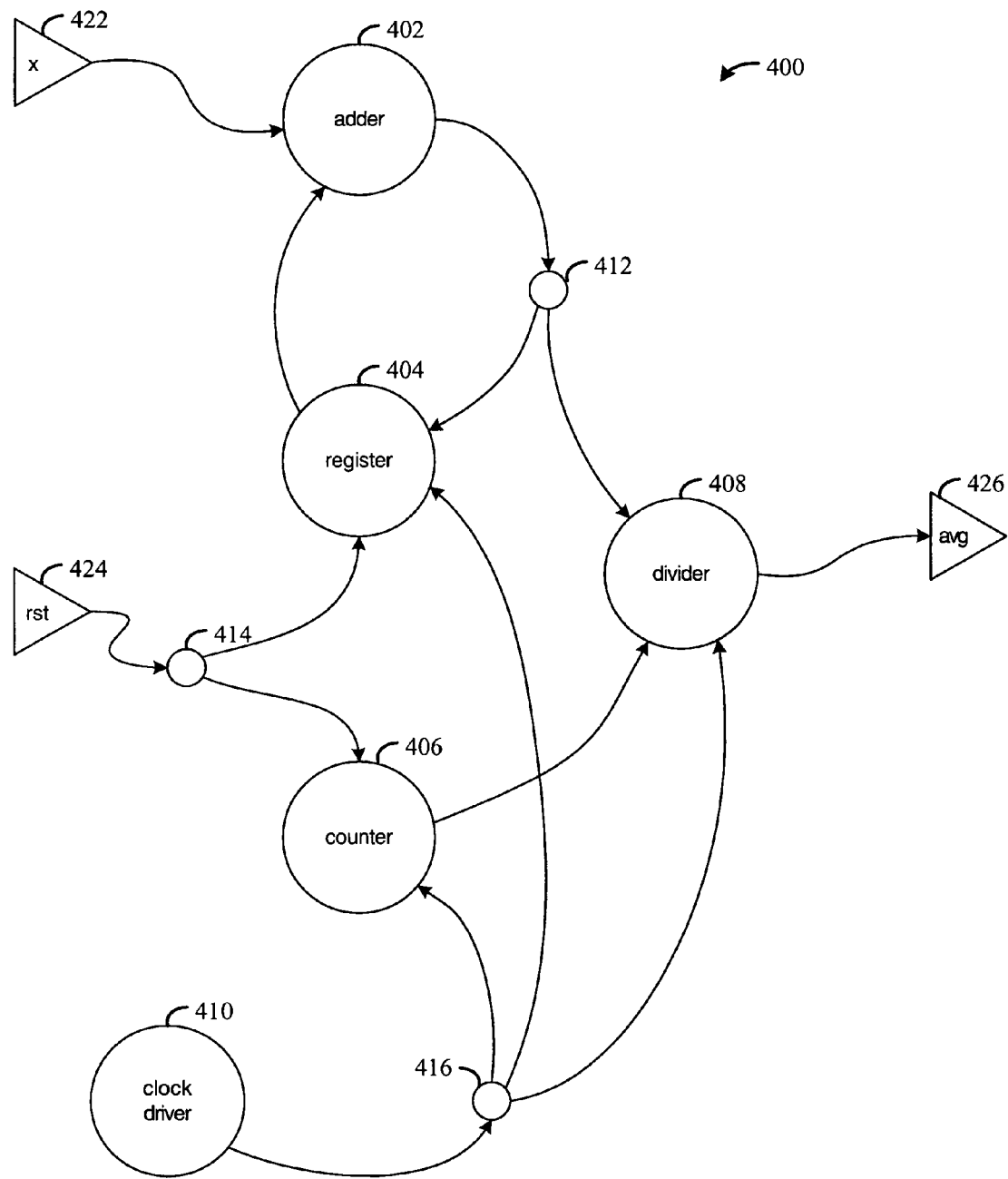
FIG. 8 illustrates a flattened view of the HDL components generated from the example design of FIGS. 2, 3, and 4.

FIG. 8 illustrates a flattened view of the HDL components 400 generated from the example design of FIGS. 2, 3, and 4. The adder, register, counter, and divider HDL components 402, 404, 406, and 408 are the HDL implementations of the adder, register, counter, and divider compiler blocks 330, 334, 336, and 340, respectively.

Clock driver 410 augments the circuit to synchronize the register 404, counter 406, and divider 408. Objects 412, 414, and 416 represent connections that are commonly referred to as "signals" or "nets." Ports 422 and 422 are the input ports to the HDL components for the values of x to average and the reset signal (rst), and port 414 is the output port on which the average value is output.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for preparing high-level electronic circuit designs and has been found to be particularly applicable and beneficial in high-level modeling systems. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for compiling high-level blocks of an electronic hardware design in a high-level modeling system (HLMS) into hardware description language (HDL) components, comprising:
    establishing clock requirements for the electronic hardware design;
    traversing depth-first a hierarchy of high-level blocks;
    generating, while traversing the hierarchy, associated compiler blocks for the high-level blocks, wherein each compiler block includes data that describes hardware ports associated with a high-level block and a name of an HDL component to be used to implement the compiler block;
    generating, while traversing the hierarchy and in response to a high-level block in the hierarchy having no sub-blocks, an HDL component consistent with the clock requirements from the associated compiler block; and
    freeing memory associated with a compiler block after generating the HDL component from the compiler block and before generating an HDL component from another compiler block.

2. The method of claim 1, further comprising:
    establishing explicit connections from implicit connections between the high-level blocks, and wherein the HDL components generated in the one pass are consistent with the explicit connections.

3. The method of claim 1, wherein each compiler block includes a description of one or more hardware ports and a name of an HDL entity to be used to implement the compiler block.

4. The method of claim 1, wherein the step of propagating includes saving the selected implementation information in association with a parent compiler block of an implemented compiler block.

5. The method of claim 1, wherein:
    the step of generating compiler blocks includes associating a type attribute with each compiler block, wherein the type indicates a type of method by which an HDL component is to be generated from the compiler block; and
    the step of generating the HDL component includes generating the HDL component with the type of method specified by the type attribute associated with the compiler block.

6. The method of claim 5, further comprising:
    wherein the type attribute includes a core-type attribute; and
    the step of generating the HDL component further includes generating the HDL component from a logic core and user-specified parameters associated with a high-level block.

7. The method of claim 6, wherein a core-type compiler block includes a name of an HDL entity and instance name to be used for the HDL component, directions of ports, and the user-specified parameters.

8. The method of claim 5, further comprising:
wherein the type attribute includes a scripting-type attribute; and
the step of generating the HDL component further includes applying a predefined script to a predefined HDL template for a scripting-type compiler block.

9. The method of claim 8, wherein a scripting-type compiler block includes a name of an HDL entity and instance name to be used for the HDL component, directions of ports, a name of an HDL template, and a name of a script.

10. The method of claim 5, further comprising:
wherein the type attribute includes a netlist-type attribute; and
the step of generating the HDL component further includes generating, for a netlist-type compiler block, an HDL entity that declares each sub-block as an instance and generating HDL code that connects the instance.

11. An article of manufacture, comprising:
an electronically readable medium configured with instructions for causing a processor to perform the steps including,
determining clock requirements in an electronic hardware design;
establishing explicit connections from implicit connections between the high-level blocks;
traversing depth-first a hierarchy of high-level blocks;
generating, while traversing the hierarchy, associated compiler blocks for the high-level blocks, wherein each compiler block includes data that describes hardware ports associated with a high-level block and a name of an HDL component to be used to implement the compiler block and has an associated type attribute that indicates a type of method by which an HDL component is to be generated from the compiler block;
generating, while traversing the hierarchy and in response to a high-level block in the hierarchy having no sub-blocks, an HDL component consistent with the clock requirements and explicit connections from the associated compiler block, wherein the generating uses the type of method specified by the type attribute associated with the compiler block; and
freeing memory associated with a compiler block after generating the HDL component from the compiler block and before Generating an HDL component from another compiler block.

12. The article of manufacture of claim 11, wherein the electronically readable medium is configured with further instructions for causing a processor, to perform the step comprising saving the selected implementation information in association with a parent compiler block of an implemented compiler block for propagating selected implementation information of each HDL component for use in generating related HDL components.

13. The article of manufacture of claim 11, wherein the electronically readable medium is configured with further instructions for causing a processor to perform the steps comprising:
in generating compiler blocks, associating a type attribute with each compiler block, wherein the type indicates a type of method by which an HDL component is to be generated from the compiler block; and
in generating HDL components, generating each HDL component with the type of method specified by the type attribute associated with the compiler block.

14. The article of manufacture of claim 13, wherein the type attribute includes a core-type attribute, and the electronically readable medium is configured with further instructions for causing a processor, in generating HDL components, to perform the step comprising generating an HDL component from a logic core and user-specified parameters associated with the high-level block.

15. The article of manufacture of claim 14, wherein a core-type compiler block includes a name of an HDL entity and instance name to be used for the HDL component, directions of ports, and the user-specified parameters.

16. The article of manufacture of claim 13, wherein the type attribute includes a scripting-type attribute, and the electronically readable medium is configured with further instructions for causing a processor, in generating HDL components, to perform the step comprising applying a predefined script to a predefined HDL template for a scripting-type compiler block.

17. The article of manufacture of claim 16, wherein a scripting-type compiler block includes a name of an HDL entity and instance name to be used for the HDL component, directions of ports, names of HDL templates, and names of scripts.

18. The article of manufacture of claim 13, wherein the type attribute includes a netlist-type attribute, and the electronically readable medium is configured with further instructions for causing a processor, in generating HDL components, to perform the step comprising generating, for a netlist-type compiler block, an HDL entity that declares each sub-block as an instance and generating HDL code that connects the instances.

* * * * *